United States Patent [19]

Doi et al.

[11] Patent Number: 5,645,123
[45] Date of Patent: Jul. 8, 1997

[54] SEMICONDUCTOR DEVICE HAVING TEMPERATURE REGULATION MEANS FORMED IN CIRCUIT BOARD

[75] Inventors: Kazuhide Doi; Naohiko Hirano, both of Kawasaki, Japan

[73] Assignee: Kabushiki Kaisha Toshiba, Kawasaki, Japan

[21] Appl. No.: 352,780

[22] Filed: Dec. 1, 1994

[30] Foreign Application Priority Data

Dec. 28, 1993 [JP] Japan ............................. 5-352837

[51] Int. Cl.$^6$ ............................................. F25B 29/00
[52] U.S. Cl. ................. 165/48.1; 219/209; 174/250; 174/252; 174/255; 361/719; 361/720
[58] Field of Search ................. 165/48.1; 219/209; 174/250, 252, 255; 361/719, 720, 721

[56] References Cited

U.S. PATENT DOCUMENTS

| | | | |
|---|---|---|---|
| 3,440,407 | 4/1969 | Goltsos et al. | 219/209 |
| 3,887,785 | 6/1975 | Ahlport | 219/209 |
| 4,374,316 | 2/1983 | Inamori et al. | 219/209 |
| 4,739,443 | 4/1988 | Singhdeo | 174/252 |
| 5,010,233 | 4/1991 | Henschen et al. | 219/209 |
| 5,367,434 | 11/1994 | Griffin et al. | 174/252 |

OTHER PUBLICATIONS

IBM Technical disclosure bulletin vol. 23, No. 11 Apr. 1981.
IBM Tehnical disclosure bulletin vol. 24 No. 3 Aug. 1981.

*Primary Examiner*—Thomas E. Denion
*Assistant Examiner*—Mark Sgantzos
*Attorney, Agent, or Firm*—Finnegan, Henderson, Farabow, Garrett & Dunner, L.L.P.

[57] ABSTRACT

A semiconductor device according to the present invention includes a resistant heating element as a temperature regulation means on a circuit board. A semiconductor chip of the device is connected to the circuit board through connecting electrodes. A difference in temperature between the semiconductor chip and circuit board is kept at a fixed value by controlling the resistant heating element.

8 Claims, 4 Drawing Sheets

SEMICONDUCTOR DEVICE HAVING TEMPERATURE REGULATION MEANS FORMED IN CIRCUIT BOARD

BACKGROUND OF THE INVENTION

1. Field of the Invention

The present invention relates to a semiconductor device having a structure wherein a semiconductor element is connected to a circuit board by connecting electrodes such as projecting electrodes and, more particularly, to a semiconductor device having a temperature regulation means formed in a circuit board.

2. Description of the Related Art

Conventionally, a semiconductor element (referred to as a chip hereinafter) formed on a die pad is mounted on a circuit board by electrically bonding the distal ends of a plurality of leads leading from the semiconductor element to a wiring pattern formed on the circuit board, or a semiconductor element is directly mounted on a circuit board and they are electrically connected to each other by wire bonding or TAB (Tape Automated Bonding). However, the mounting of the chip on the circuit board by leading the leads from the chip is a great hindrance to high-density mounting of the semiconductor device. In particular, a semiconductor device has recently been used in many ways, and the mounting density is increasingly improved. To mount the chip using leads does not meet the requirement of high density, while a thin circuit board such as a memory card is employed and the number of memory devices tends to increase. Therefore, one takes notice of a flip chip method of directly connecting a plurality of connecting electrodes formed on a chip to a circuit board.

FIG. 1 shows a prior art semiconductor device in which a plurality of silicon chips are connected to a circuit board 2 by flip chip bonding. Such a semiconductor device is disclosed in U.S. Pat. No. 3,401,126 and U.S. Pat. No. 3,429,040. Each silicon chip 1 includes pad electrodes 7 formed on the surface thereof and constituted by aluminum or the like to serve as connecting electrodes 10 electrically connected to an integrated circuit formed in the chip, and projecting electrodes 3 of about 100 μm in height bonded onto the pad electrodes 7 and constituted by low melting-point metal containing Pb, Sn, or the like, as the principal ingredient. The projecting electrodes 3 are electrically connected to circuit patterns 8 of a wiring layer formed on the surface of the circuit board 2. The projecting electrodes 3 can be constituted by gold as well as the low melting-point metal or obtained by forming a conductive layer on the surface of an insulative ball-shaped object. Pb-Sn solder, In-Sn solder, etc. are known as the low melting-point metal. The circuit board can be replaced with a printed board, a ceramic board, a silicon board, and the like, which have a laminated structure impregnating a glass material with epoxy resin.

In general, the temperature of the semiconductor device is increased by heat generated from the semiconductor chips 1 when it is used. The heat generated therefrom is transmitted to the circuit board 2 through the projecting electrodes 3 to increase the temperature of the circuit board itself. Then the chip 1 and circuit board 2 are thermally expanded. In the flip chip bonding, if there is a difference in coefficient thermal expansion (CTE) between the semiconductor substrate and circuit board, the thermal stress caused by the difference is concentrated upon the projecting electrodes 3. FIG. 2 shows a deformation of the semiconductor device of FIG. 1, as indicated by the dotted lines. Assume that the thermal expansion coefficient of the circuit board 2 is $\alpha_{sub}$, that of the chip 1 is $\alpha_{si}$, and the distance between the neutral point of the deformation (the center of the chip) O and the projecting electrode 3 is L. If the temperature of the chip 1 and that of the circuit board 2 increase from room temperature T0 to temperature T, the thermal expansion $\Delta L1$ of the chip 1 is expressed by $\alpha_{si} \times (T-T0) \times L$, and the thermal expansion $\Delta L2$ of the circuit board 2 is given by $\alpha_{sub} \times (T-T0) \times L$. The chip 1 and circuit board 2 are therefore different in thermal expansion from each other. In FIG. 2, the thermal expansion coefficient $\alpha_{sub}$ of the circuit board 2 is larger than that $\alpha_{Si}$ of the silicon chip 1, and the thermal expansion of the circuit board 2 is larger than that of the chip 1 ($\Delta L1 < \Delta L2$). Consequently, as described above, the thermal stress is concentrated on the projecting electrodes 3 serving as connecting electrodes of the chip 1 and circuit board 2, thereby decreasing the reliability of the semiconductor device.

If, in particular, low melting-point metal such as solder containing Pb or Sn as the main ingredient is used for the connecting electrodes such as the projecting electrodes 3, the concentration of the thermal stress appears as a plastic strain since the yield stress of the low melting-point metal is small. When the semiconductor device is repeatedly turned on and turned off, a plastic strain repeatedly occurs on the projecting electrodes and causes them to be fatigued more greatly, thereby reducing the long-period reliability of the semiconductor device.

Even though a material having the same thermal expansion coefficient as that of the silicon substrate or silicon chip is selected as the circuit board, if there occurs a difference in temperature between the chip and circuit board in the transition of temperature, fatigue becomes worse on the projecting electrodes 3 and the reliability of the semiconductor device is lowered, as described above.

The long-period reliability of the projecting electrodes 3 formed on the chip 1 lowers more and more since the distance L shown in FIG. 2 increases as the size of the chip 1 becomes large.

SUMMARY OF THE INVENTION

The present invention has been developed in consideration of the above situation and its object is to provide a semiconductor device having a temperature regulation means formed in a circuit board with high reliability, the circuit board being exactly connected to projecting electrodes serving as connecting electrodes of a semiconductor chip for a long period of time.

To attain the above object, the present invention provides a semiconductor device comprising:

a circuit board;

temperature regulation means formed in the circuit board; and a semiconductor chip having connecting electrodes and connected to the circuit board through the connecting electrodes.

In the semiconductor device having the above constitution, the fatigue of the connecting electrodes caused when the device is repeatedly turned on and turned off can be reduced remarkably or released effectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described, with reference to the accompanying drawings.

Figure 1:
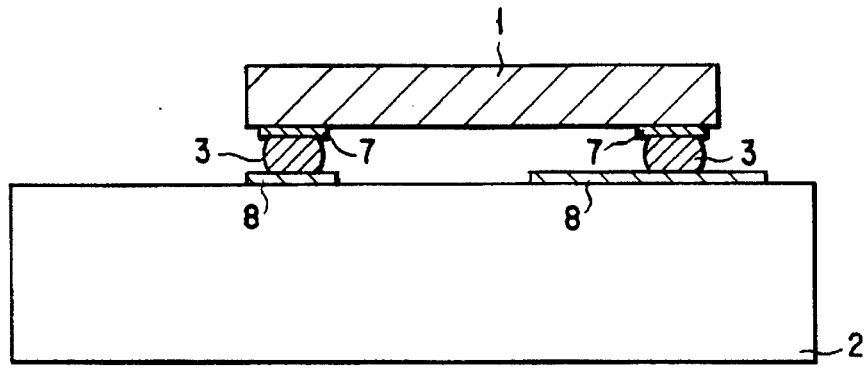
FIG. 1 is a schematic side view of a prior art semiconductor device having a flip chip bonding structure.
Figure 2:
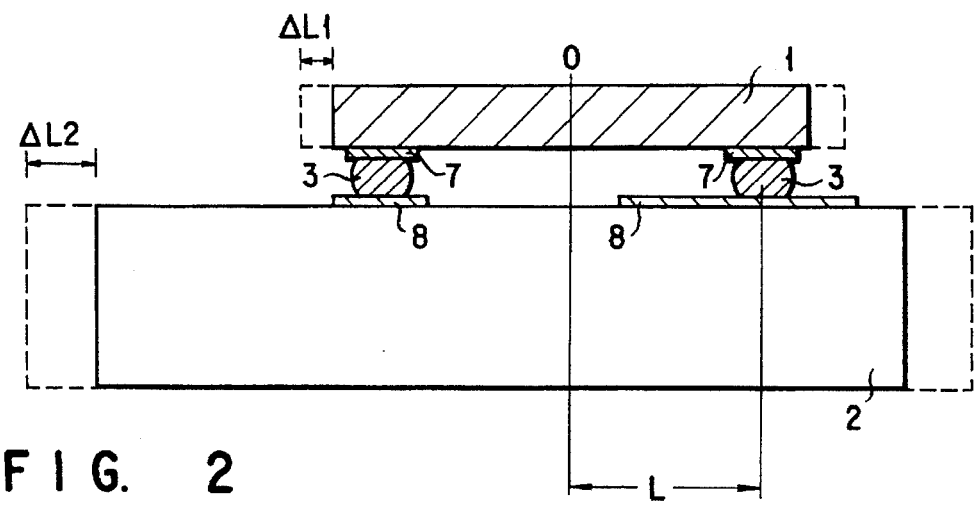
FIG. 2 is a view for explaining the thermal expansion of the semiconductor device shown in FIG. 1 which is in use.
Figure 3:
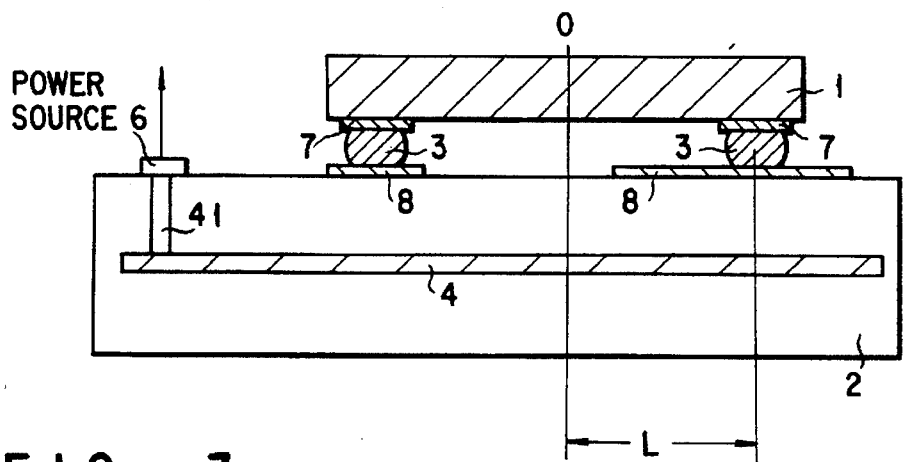
FIG. 3 is a cross-sectional view showing a semiconductor device according to one embodiment of the present invention in which a temperature regulation means is formed in a circuit board.
Figure 4:
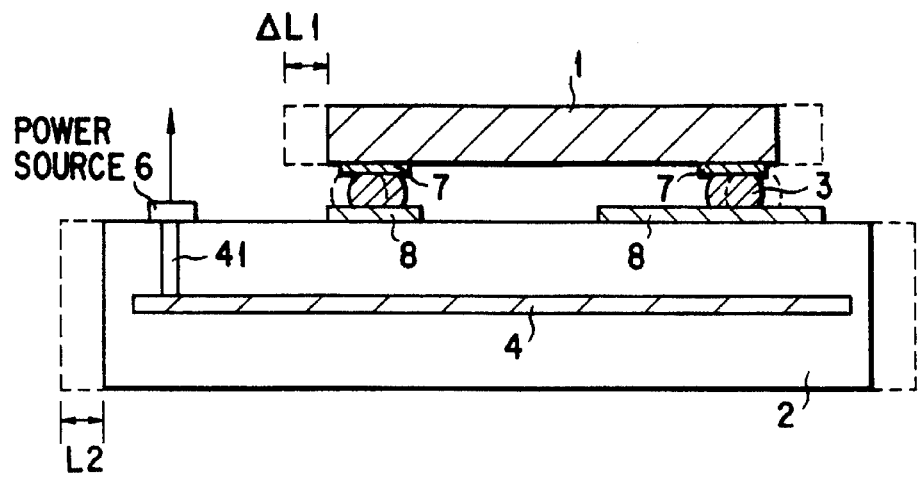
FIG. 4 is a view for explaining the thermal expansion of the semiconductor device shown in FIG. 3 which is in use.

First a semiconductor device according to the first embodiment will be described with reference to FIGS. 3 and 4. FIG. 3 is a cross-sectional view of the semiconductor device which has not yet been used, and FIG. 4 is also a cross-sectional view of the semiconductor device which is in use. A circuit board 2 has a laminated structure of, for example, synthetic resin, and the laminated structure is obtained by laminating a plurality of insulating materials impregnating glass fibers with epoxy resin and thermally compressing them. If a circuit wiring is formed on the surface of each of the insulating substrates, the circuit board 2 can be formed as a multilayer wiring structure. A plurality of semiconductor chips 1 of, e.g., silicon are mounted on the circuit board 2 by flip chip bonding through a plurality of projecting electrodes 3. Each chip 1 includes pad electrodes 7 of aluminum or the like on the surface thereof, and the pad electrodes are electrically connected to an integrated circuit formed in the chip 1. The chip 1 also includes the projecting electrodes 3 constituted by low melting-point metal such as Pb—Sn solder. The height of each of the projecting electrodes 3 is about 100 μm. The projecting electrodes 3 are electrically connected to circuit patterns 8 of an aluminum wiring layer formed on the surface of the circuit board 2 and thus mounted on the circuit board 2.

The projecting electrodes 3 of low melting-point metal can be replaced with electrodes of gold or electrodes obtained by forming a conductive layer on the surface of an insulative ball-shaped object. In addition to the Pb-Sn solder, In-Sn solder and the like are known as the low melting-point metal. The circuit board can be replaced with a printed board, a ceramic board, a silicon board, a glass board, and the like, which have a laminated structure impregnating a glass material with epoxy resin.

The circuit board 2 includes a temperature regulation means 4 such as a resistant heating element. More specifically, a resistant heating element 4 is placed as a temperature regulation means on one of a plurality of insulating materials impregnating glass fibers with epoxy resin, and these materials are put one on another and thermally compressed such that the resistant heating element 4 is buried in the circuit board 2. A power source 6 for the resistant heating element 4 is provided on the circuit board 2 and connected to the resistant heating element 4 via a connecting wire 41. The power source 6 can be used in common with a power source for a semiconductor integrated circuit formed in the chip 1. The resistant heating element 4 is used to increase the temperature of the circuit board 2.

A difference in thermal expansion due to an increase in temperature between the chip 1 and circuit board 2 is decreased by using the resistant heating element 4 when the semiconductor device is being used. If the temperature of the semiconductor device in use rises from room temperature T0 to temperature T1, the thermal expansion $\Delta L1$ of the chip 1 and that $\Delta L2$ of the circuit board 2 are expressed as follows:

$$\Delta L1 = \alpha_{si} \times (T-T0) \times L$$

$$\Delta L2 = \alpha_{sub} \times (T-T0) \times L$$

where L represents a distance between the neutral point (the center of the chip 1) O and the projecting electrode 3. According to these equations, the thermal expansions of the chip 1 and circuit board 2 due to the increase in the temperature of the semiconductor device depend upon thermal expansion coefficients $\alpha Si$ and $\alpha sub$ of the chip and circuit board, respectively, since the temperatures of the chip and circuit board increase to the same value. If the two thermal expansion coefficients are not the same, $\Delta L1$ and $\Delta L2$ are not equal to each other. The thermal expansion coefficient of the circuit board 2 is usually larger than that of the chip 1 ($\alpha L1 < \alpha L2$). Therefore, in order to equalize both the thermal expansions ($\Delta L1 = \Delta L2$) when the semiconductor device is being used, the temperature of the circuit board 2 is set to temperature Tx, which is higher than the room temperature T0, when the device is turned off. In this case, if the temperature of the chip 1 is T1, that of the circuit board 2 is also T1.

Assume that a difference between temperature (normal temperature) T0 of the semiconductor device not in use and temperature T1 of the chip 1 when the device is in use is $\Delta TSi$ (=T1−T0), and a difference between temperature T1 of the circuit board 2 when the device is in use and temperature Tx thereof when it is turned off is $\Delta Tsub$ (=T1−Tx). The thermal expansion $\Delta L1$ of the chip 1 is represented by $\alpha Si \times \Delta TSi \times L$, and the thermal expansion $\Delta L2$ of the circuit board 2 is represented by $\alpha sub \times \Delta Tsub \times L$. The resistant heating element 4 allows the temperature Tx of the circuit board 2 to be set properly such that both the thermal expansions $\Delta L1$ and $\Delta L2$ are equalized when the semiconductor device is in use. By controlling the temperatures as described above, the stress concentrated on the projecting electrodes 3 is remarkably decreased.

The semiconductor device according to the first embodiment includes, for example, a memory, and the circuit board 2 is always heated by turning on the power source 6 even when the device is not in use. Consequently, the semiconductor device is the most suitable for a large-scale computer system and the like.

An example of use of a silicon semiconductor substrate for the circuit board 2, will now be described.

In this example, since the thermal expansion coefficients of the chip 1 and circuit board 2 are equal to each other, there cannot be a difference between the thermal expansions of the chip and circuit board even though the temperature of the semiconductor device in use increases. However it is only natural that the temperature variations of both the chip and circuit board from the turn-on or turn-off of the device to the steady state thereof are different from each other. Therefore, the temperatures of the chip and circuit board can be regulated by the temperature regulation means provided in the circuit board such that the temperatures become equal to each other.

Figure 6:
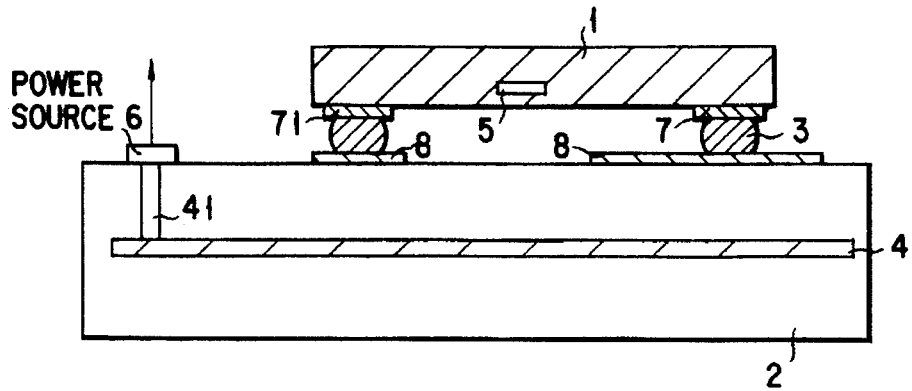
FIG. 6 is a cross-sectional view showing a semiconductor device according to another embodiment of the present invention in which a chip includes a temperature sensor.
Figure 7:
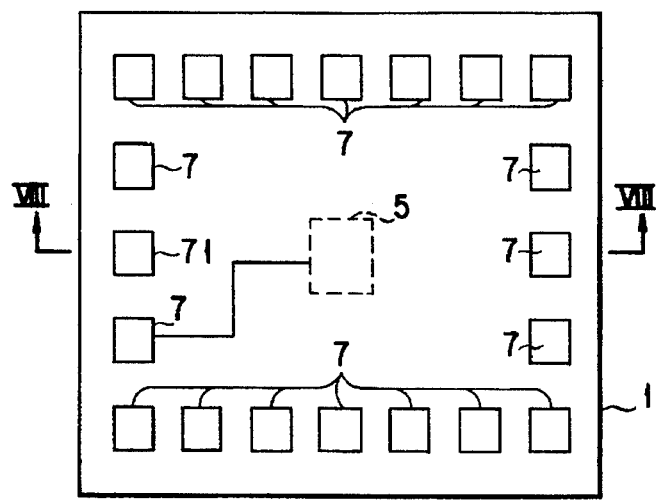
FIG. 7 is a plan view showing a chip of the semiconductor device of the present invention.
Figure 8:
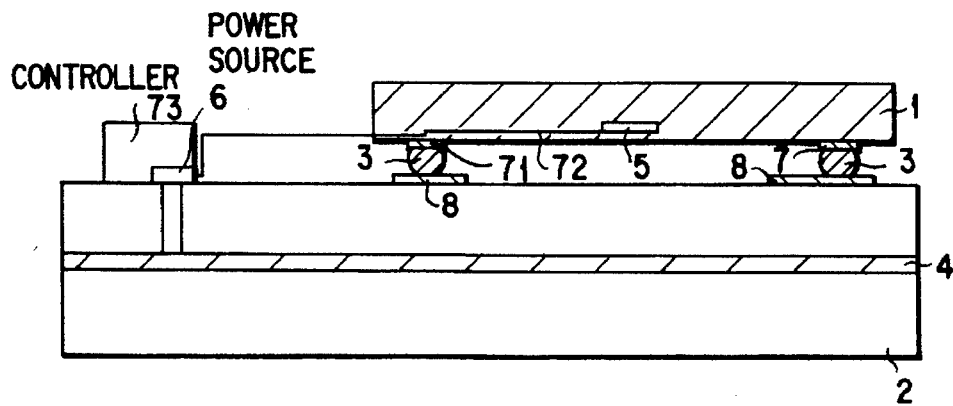
FIG. 8 is a cross-sectional view taken along the line VIII—VIII of FIG. 7 and showing a circuit board 10 having a control system for controlling a temperature regulation means in accordance with a temperature detected by a temperature sensor.

FIGS. 6 to 8 show a semiconductor device according to the second embodiment of the present invention wherein a chip 1 includes a temperature sensor 5. FIG. 6 is a cross-sectional view of the semiconductor device, FIG. 7 is a plan view of the chip 1 mounted on an alumina circuit board 2, and FIG. 8 is a cross-sectional view taken along the line A—A of FIG. 7 and showing the chip 1 mounted on the alumina circuit board 2.

A resistant heating element 4 is buried in the alumina circuit board 2, and a power source 6 is placed on the surface of the alumina circuit board 2 and electrically connected to the buried resistant heating element 4. Wiring patterns 8 are formed on the alumina circuit board 2, and projecting electrodes 3 of Pb-Sn solder formed on the chip 1 are electrically connected to the wiring patterns 8. The chip 1 is formed of silicon and includes the sensor 5. Pad electrodes 7 of aluminum are formed on the major surface of the chip 1 and on the periphery thereof. The temperature sensor 5 has, for example, a PN junction. A signal of the temperature sensor 5 is transmitted through a signal line 72 and supplied outside from one 71 of the pad electrodes 7 for the temperature sensor. While thermal expansion coefficient $\alpha Si$ of the silicon chip 1 is $3.5 \times 10^{-6}$, thermal expansion coefficient $\alpha A$ of the alumina circuit board 2 is $6.5 \times 10^{31}$ $^6$. In this embodiment, the temperature regulation means is constituted by a resistant heating element 4 of tungsten (W), molybdenum (Mo), or the like.

The alumina circuit board 2 includes a plurality of laminated alumina ($Al_2O_3$) substrates adhered to one another. The resistant heating element 4 is applied to the surface of any one of the alumina substrates by sputtering or the like, and put between the substrates, with the result that the element 4 is buried in the alumina circuit board 2. The power source 6 is placed on the circuit board 2 and connected to the resistant heating element 4 through a connecting wire 41. The power source 6 can be used in common to a power source for a semiconductor integrated circuit formed on the chip 1. The temperature sensor 5 is connected to the wiring pattern 8 on the circuit board 2 via the pad electrode 71 formed on the surface of the chip 1 and the projecting electrode 3, and also connected electrically to the power source 6. Consequently, the temperature sensor 5 monitors the temperature of the chip 1, and a signal corresponding to the temperature sensed by the sensor 5 is controlled by a controller 73. The power is thus controlled and fed back to the current of the heating element 4 in the circuit board 2, thereby properly changing the temperature of the circuit board 2.

An example of controlling the temperatures of the chip 1 and alumina circuit board 2 such that a difference therebetween is kept at a predetermined value in the semiconductor device shown in FIGS. 3 or 5, will now be described.

The temperatures of the chip 1 and alumina circuit board 2 are set to the same value, e.g., 75° C. such that the thermal expansion of both the chip 1 and alumina circuit board 2 becomes 1.8×10% in the on-state where the semiconductor device is in use. When the semiconductor device is changed from the on-state to the off-state and the temperature of the chip 1 is returned to the room temperature, e.g., 25° C., a heating temperature is regulated so as to prevent the temperature of the alumina circuit board 2 from dropping below 48° C. by controlling the resistant heating element 4 using the controller 73. The resistant heating element 4 is constituted by tungsten (W), molybdenum (Mo), or the like.

Thus a difference in temperature between the chip 1 and alumina circuit board 2 is 23° C. in the off-state of the semiconductor device. In other words, in order to set the temperatures of the chip 1 and alumina circuit board 2 in the on-state to the same value and make the thermal expansions thereof equal to each other, the temperatures have only to be regulated such that a difference between them is set to 23° C. in the off-state. By doing so, no shearing force is exerted on the projecting electrodes 3 or no plastic distortion occurs thereon.

Even though the above on- and off-states constituting one cycle are repeated a number of times, no fatigue occurs on the projecting electrodes 3. If a temperature sensor is provided alongside the alumina circuit board to measure the temperature of the alumina circuit board, the temperature can be controlled more finely. The temperature sensor can be provided outside the chip 1.

Then, the temperatures of the chip 1 and alumina circuit board 2 are set to the same value, e.g., the room temperature of 25° C. when the semiconductor device is in the off-state. If the temperature is increased up to 75° C. at the time of use of the chip 1, the alumina circuit board 2 is controlled so as to have a temperature of 52° C. by using a cooling means as a temperature regulation means. In the on-state, a difference in temperature between the chip 1 and alumina circuit board 2 is 23° C. and thus the thermal expansions of them are substantially equal to each other, with the result that no shearing force is exerted upon the projecting electrodes 3 or no plastic distortion occurs thereon. The cooling means is constituted by, for example, an electronic freezing element 4 such as a Peltier effect element. In PIG. 4, the heating element and cooling element are denoted by the same reference numeral for convenience's sake.

If, in the off-state of the semiconductor device, the temperatures of the chip 1 and almina circuit board 2 are caused to differ from each other, and the temperature of the chip 1 is set to, e.g., the room temperature of 25° C., the temperature of the almina circuit board 2 is increased up to, e.g., 30° C., which is higher than the room temperature, using a resistant heating element as a temperature regulation means. In the on-state where the semiconductor device is being used, when the temperature of the chip 1 reaches 75° C., that of the almina circuit board 2 is decreased to 52° C. using an electronic freezing element, such as a Peltier effect element, as a cooling element serving as a temperature regulation means. A difference in temperature between them is 23° C. in this case.

If the above on/off operations of the semiconductor device including the temperature regulation operation constitute one cycle, the thermal expansions of the chip 1 and alimina circuit board 2 per cycle are substantially equal to each other. Consequently, the fatigue caused on the projecting electrodes 3 when the on/off operations are repeated, can be lessened, and the reliability of the semiconductor device can be improved for a long period of time.

Figure 5:
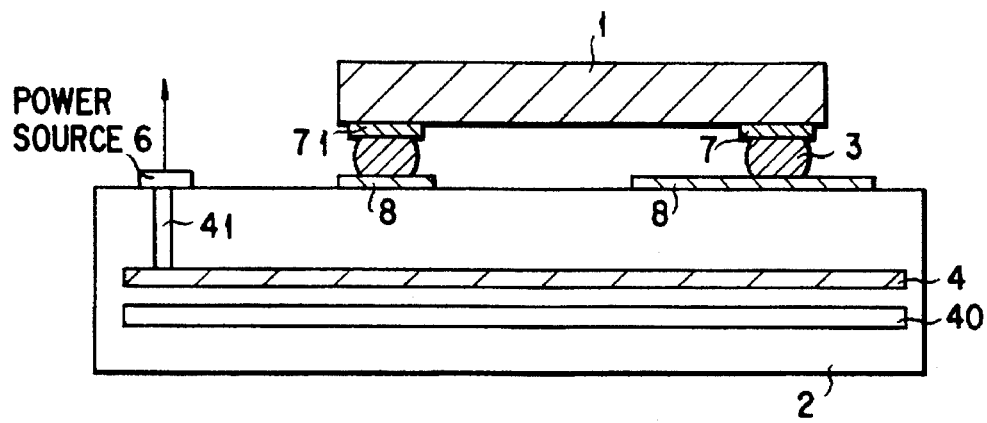
FIG. 5 is a cross-sectional view showing a semiconductor device according to one embodiment of the present invention in which a heating means and a cooling means are formed in a circuit board as a temperature regulation means.

As described above, there is a case where only the heating means or only the cooling means is used as the temperature regulation means formed in the circuit board 2, and there is another case where both the heating means 4 and cooling means 40 are used together as shown in FIG. 5. In the latter case, both the means 4 and 40 are buried in the almina circuit board 2 at different locations.

The projecting electrodes of the semiconductor device are fatigued with the repetitive on/off operations and thus likely to be removed from the circuit board. In particular, when the material of the projecting electrodes is low melting-point metal such as Pb-Sn solder, they are fatigued more remarkably.

Figure 9:
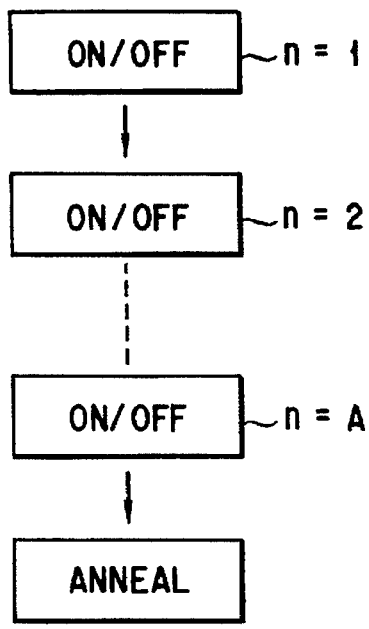
FIG. 9 is a flowchart showing a process of annealing the projecting electrodes of the semiconductor device of the present invention.
Figure 10:
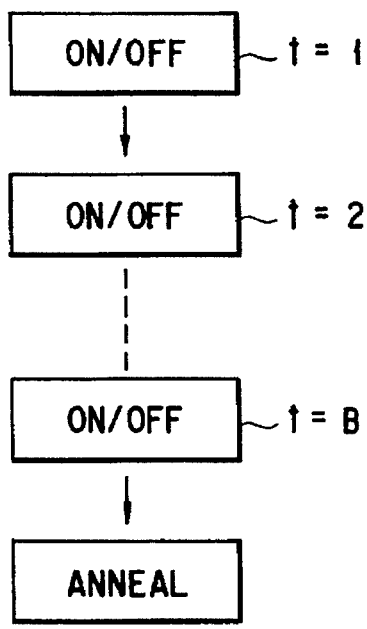
FIG. 10 is a flowchart showing another process of annealing the projecting electrodes of the semiconductor device of the present invention.

However, the material of the projecting electrodes can be released from its fatigue by annealing them at a temperature in the vicinity of the melting point thereof. Therefore, as shown in FIG. 8, the projecting electrodes of the above embodiments are annealed by the heating element after the on/off operations of the semiconductor device are performed a predetermined number of times, e.g., n times (n=1, 2, . . . ). Furthermore, the projecting electrodes can be annealed by the heating element by performing the on/off operations periodically for a predetermined period of time, e.g., for t hours (t=1, 2, . . . ), as shown in FIG. 9.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A flip-chip type semiconductor device comprising:

a circuit board having a wiring circuit on one surface thereof;

temperature regulation means formed in said circuit board; and a semiconductor chip having connecting electrodes on one surface thereof, said connecting electrodes facing the one surface of the circuit board and being connected with the wiring circuit on the one surface of said circuit board in a manner resulting in transfer of stress due to thermal expansion between the chip and the circuit board.

2. The semiconductor device according to claim 1, wherein said temperature regulation means includes heating means.

3. The semiconductor device according to claim 2, wherein said heating means is a resistant heating element.

4. A semiconductor device comprising:

a circuit board having a wiring circuit on one surface thereof;

temperature regulation means formed in said circuit board; and a semiconductor chip having connecting electrodes on one surface thereof, said connecting electrodes being connected by direct engagement with the wiring circuit on the one surface of said circuit board;

wherein said temperature regulation means includes heating means and cooling means.

5. A semiconductor device comprising:

a circuit board having a wiring circuit on one surface thereof;

temperature regulation means formed in said circuit board; and a semiconductor chip having connecting electrodes on one surface thereof, said connecting electrodes being connected by direct engagement with the wiring circuit on the one surface of said circuit board;

wherein said connecting electrodes have a melting temperature and are released from fatigue by annealing with heat Supplied by said temperature regulation means at a temperature in the region of the melting temperature thereof.

6. A semiconductor device comprising:

a circuit board;

temperature regulation means formed in said circuit board, said temperature regulation means including cooling means comprising an electronic freezing element; and a semiconductor chip having connecting electrodes and connected to said circuit board through the connecting electrodes.

7. The semiconductor device according to claim 6, further comprising control means for controlling said temperature regulation means upon receiving an output from sensor means formed in said semiconductor chip.

8. A semiconductor device comprising:

a circuit board having a wiring circuit on one surface thereof;

a semiconductor chip having connecting electrodes on one surface thereof, said connecting electrodes being connected by direct engagement with the wiring circuit on the one surface of said circuit board, said circuit board and said semiconductor chip having different coefficients of thermal expansion; and temperature regulation means, formed in said circuit board, for controlling at least one of thermal expansion and contraction in the circuit board to maintain a substantially constant relative size of the circuit board and the semiconductor chip.

* * * * *